United States Patent [19]

Tran et al.

[11] Patent Number: 5,339,518

[45] Date of Patent: Aug. 23, 1994

[54] METHOD FOR MAKING A QUAD LEADFRAME FOR A SEMICONDUCTOR DEVICE

[75] Inventors: Truoc T. Tran; Wilhelm Sterlin, both of Austin, Tex.

[73] Assignee: Motorola, Inc., Schaumburg, Ill.

[21] Appl. No.: 88,689

[22] Filed: Jul. 6, 1993

[51] Int. Cl.⁵ .............................. H01R 43/00
[52] U.S. Cl. .................................. 29/827; 29/423; 437/217; 437/220
[58] Field of Search .................. 29/423, 827; 437/217, 437/220; 174/52.2

[56] References Cited

U.S. PATENT DOCUMENTS

| | | | |
|---|---|---|---|
| 3,698,074 | 10/1982 | Helda et al. | 29/423 X |
| 4,445,736 | 5/1984 | Hopkins | 29/827 X |
| 4,554,404 | 11/1985 | Gilder, Jr. et al. | 174/52 |
| 4,651,415 | 3/1987 | Frampton | 29/827 |
| 4,653,174 | 3/1987 | Gilder et al. | 29/827 X |
| 4,663,650 | 5/1987 | Gilder, Jr. et al. | |
| 4,663,651 | 5/1987 | Gilder, Jr. et al. | |
| 4,820,658 | 4/1989 | Gilder, Jr. et al. | 437/209 |
| 4,872,260 | 10/1989 | Johnson et al. | 29/827 |
| 4,951,119 | 8/1990 | Yonemochi et al. | |

FOREIGN PATENT DOCUMENTS

| | | | |
|---|---|---|---|
| 163856 | 12/1985 | European Pat. Off. | 29/827 |
| 2173342A | 10/1986 | European Pat. Off. | |

*Primary Examiner*—Carl J. Arbes
*Attorney, Agent, or Firm*—Minh-Hien N. Clark

[57] ABSTRACT

A quad leadframe (30) for a semiconductor device is made from multiple dual-in-line leadframes (10). Two dual-in-line leadframes (10) are provided, wherein each leadframe has two opposing siderails (12) with a plurality of leads (14) connected to those siderails. The leads have a metal clad layer (16) on lead tips which are distal to the two siderails. Each leadframe also has another two opposing siderails (18) which are not connected to any leads. The two leadframes are stacked on top of one another, wherein one leadframe is rotated by substantially 90° with respect to the other leadframe such that the leads of one leadframe are perpendicular to the leads of the second leadframe to form a quad configuration. The siderails enable alignment of the leadframes to each other. The two leadframes can then be optionally tack welded together at any location along the siderails.

18 Claims, 3 Drawing Sheets

METHOD FOR MAKING A QUAD LEADFRAME FOR A SEMICONDUCTOR DEVICE

FIELD OF THE INVENTION

The field of the invention relates to a method for making a quad leadframe for a semiconductor device and a method for making a semiconductor device generally, and more specifically to a method for making a quad leadframe using multiple leadframes and a method for making a quad semiconductor device using multiple leadframes.

BACKGROUND OF THE INVENTION

Currently, there is no manufacturable method for stamping leadframes for a ceramic quad (CERQUAD) package. The current method for making a CERQUAD leadframe involves etching or stamping a bare Alloy 42 leadframe. Each leadframe is then aluminized either through an electron beam evaporation process (EBEP) or through an ion plating process (IPP). The aluminum is necessary to promote adhesion at the lead tips for the aluminum wire bonds that are used with a ceramic package. However, it is undesirable to have exposed aluminum on leads external to the package body because the aluminum layer complicates a lead finishing process, such as solder or tin plating. Lead finishing of the external leads enables soldering of the leads to a board. Therefore, the EBEP or IPP processes are used to precisely deposit aluminum only at the lead tips of the CERQUAD leadframe. Either of these two processes are very costly in addition to being very slow. The fact that each CERQUAD leadframe must be individually aluminized translates into a long cycle time for making the CERQUAD leadframe. Furthermore, the cost of aluminizing the lead tips of a CERQUAD leadframe accounts for approximately two-thirds of the cost of the leadframe due to the EBEP or IPP process. Although a stamped leadframe traditionally costs less per leadframe as compared to an etched leadframe, the initial cost of a stamping tool is very expensive, so the volume of leadframes produced per stamping tool must be high enough to make the stamping tool cost effective. However, in the case of a CERQUAD leadframe, the price difference between an etched and a stamped bare Alloy 42 leadframe is negligible when compared to the aluminization cost of the lead tips. The major reduction in cost of a CERQUAD leadframe must come from reducing the cost of aluminizing the lead tips.

Leadframes for dual-in-line ceramic packages are less expensive in comparison to CERQUAD leadframes. The surface of the lead tips of dual-in-line leadframes is aluminum clad instead of plated or electron beam deposited. Cladding is an old and well-known process in the art. The cladding process is less expensive than either EBEP or IPP because an aluminum clad stripe is simply rolled onto a bare Alloy 42 strip. The aluminum stripe becomes laminated onto the bare Alloy 42 metal. The aluminum clad Alloy 42 strip can then be stamped into a dual-in-line leadframe. No other aluminization process, such as EBEP or IPP, is required since the lead tips are already aluminum clad. Because the leads are only on two sides of the leadframe, no aluminum is exposed outside of the package body after the device is assembled. Any aluminum clad on the non-leaded siderails is discarded along with the siderails during the trim and form process.

A CERQUAD leadframe would be more cost effective to produce if an aluminum cladding process could be used instead of either the EBEP or IPP process.

SUMMARY OF THE INVENTION

The invention provides, in one embodiment, a method for making a quad leadframe for a semiconductor device. Two dual-in-line leadframes are provided, wherein each leadframe has two opposing siderails with a plurality of leads connected to those siderails. The plurality of leads have a metal clad layer on lead tips which are distal to the two siderails. Each leadframe also has another two opposing siderails which are not connected to any leads. The two leadframes are stacked on top of one another, wherein one leadframe is rotated by substantially 90° with respect to the other leadframe such that the leads of one leadframe are 90° out of phase with the leads of the second leadframe to form a quad configuration. The siderails are used for alignment of the leadframes after the leadframes are stacked and rotated with respect to each other. The two leadframes can then be optionally tack welded together at any location along the siderails. The invention also provides a method for making a quad semiconductor device using the quad leadframe made by the above method.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
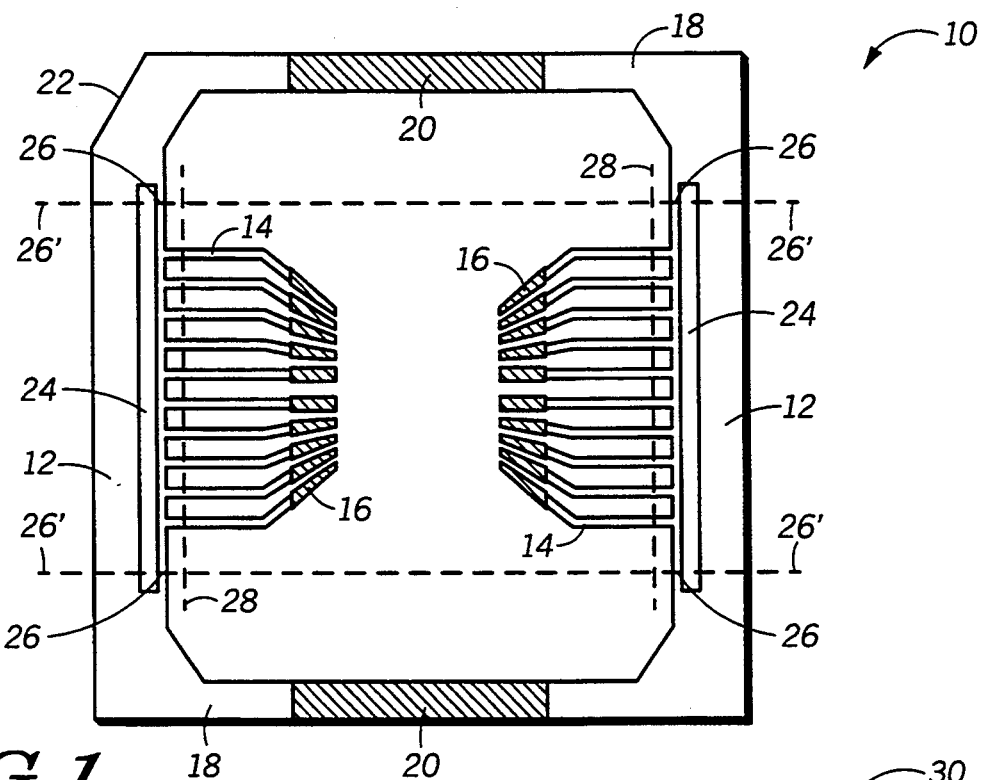
FIG. 1 illustrates, in a top view, a dual-in-line leadframe configuration which is one component of an embodiment of the invention.

The invention is now discussed with reference to the figures. FIG. 1 illustrates, in a top view, a leadframe 10 having a dual-in-line lead configuration. The leadframe 10 is made from a conductive metal alloy, such as Alloy 42, which is a metal alloy typically used for leadframes in the semiconductor industry. Copper is another common leadframe material employed in the art, but Alloy 42 is more often used in ceramic packaging than is copper. The leadframe 10 has two opposing siderails 12 and a plurality of leads 14 connected to the two siderails 12. The leads 14 have a metal clad layer 16 on the lead tips which are distal to the two opposing siderails 12. The metal clad layer is typically aluminum to promote adhesion and reliability of the aluminum wire bonds that are normally used in ceramic packaging to electrically connect a semiconductor die to the leadframe. Gold is an alternative metal layer but is more expensive than aluminum. Additionally, the high processing temperatures associated with ceramic packaging tend to create intermetallic formation between a gold and aluminum interface. Intermetallics are believed to be detrimental to the strength of a metal to metal bond. Therefore, aluminum is the preferred cladding material. Cladding is a well known process in the art; and as mentioned previously, cladding is a mass volume automated process, and is therefore a less expensive process than is either EBEP or IPP.

As illustrated in FIG. 1, the leadframe 10 also has another two opposing siderails 18 which are not connected to any leads, hence the term "dual-in-line" lead configuration. The siderails 18 have a metal clad layer 20 because of the cladding process, where an aluminum cladding stripe has been rolled onto a bare metal strip before the leadframe is stamped out of the clad metal. Basically, the leadframe 10 is manufactured as a standard dual-in-line leadframe configuration, which can be easily and cost effectively manufactured through a stamping process. However, it is important to note that the siderails 12 and 18 must be designed such that they can later be used for alignment in the making of a quad leadframe configuration. Thus, one corner of the leadframe 10 is illustrated as having a chamfer 22 so that the subsequently discussed method of making a quad leadframe can be more easily understood. It should also be noted that the two siderails 12 have slots 24 along the length of the siderails. These slots 24 facilitate the excising of the leads 14 from the leadframe 10 during assembly by cutting through the siderails 12 along locations 26. Another trim and form step cuts the leads 14 along lines 28 to singulate the leads 14 and form them into a desired external lead configuration, such as gull-wing-leaded. If slots 24 are not present in the siderails, then the first excising step would cut through the width of the siderails along lines 26'.

Figure 2:
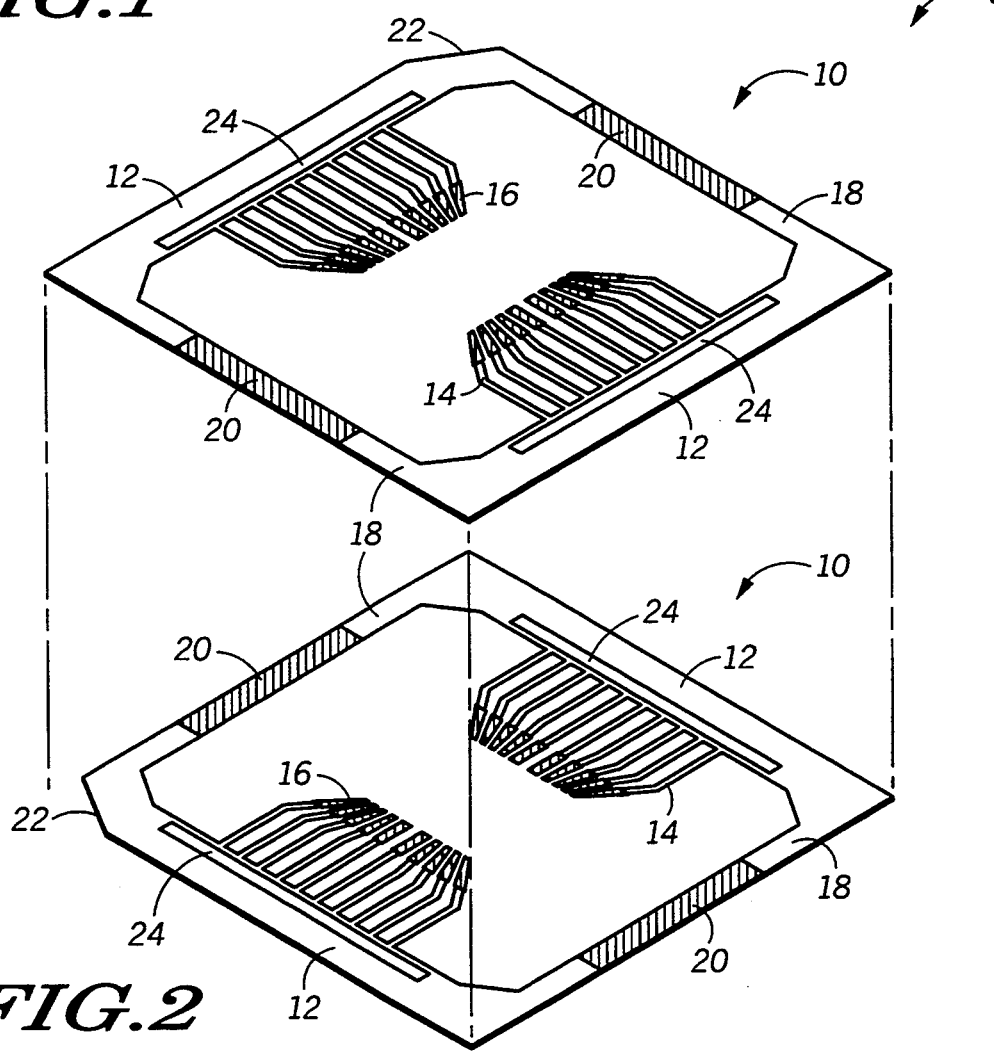
FIG. 2 illustrates, in an exploded orthogonal view, a process step of making a quad leadframe using the dual-in-line leadframe of FIG. 1, in accordance with a method of the invention.

A quad leadframe configuration has leads on four sides, as opposed to a dual-in-line leadframe configuration which only has leads on two sides. As mentioned previously, dual-in-line leadframes can be cost effectively produced because the aluminum cladding process is less expensive in comparison to either an aluminum EBEP or IPP process which are currently required with a quad leadframe. FIG. 2 illustrates, in an exploded orthogonal view, a method for making a quad leadframe 30. As shown, two dual-in-line leadframes 10 of FIG. 1, are combined to form a quad leadframe configuration. The two leadframes 10 are stacked on top of one another. One leadframe 10 is rotated by 90° with respect to the other leadframe 10 such that the leads 14 are 90° out of phase with each other. The siderails 12 and 18 are used for alignment so that the leads of one leadframe 10 are positioned correctly with respect to the leads of the second leadframe 10 to form a quad lead configuration. The lead tips are aluminum clad, and the siderails are also partially aluminum clad due to the inherent nature of the cladding process. However, the partially aluminum clad siderails are discarded during assembly of the semiconductor device so that no aluminum is exposed externally to a packaged device after assembly is fully completed.

As illustrated in FIG. 2, the chamfers 22 clearly indicate the orientation/rotation of the leadframes with respect to one another. Other methods of determining correct rotation and alignment are also possible. For example, tooling holes or alignment holes (not illustrated) can be designed into the siderails such that the holes match when the two leadframes are stacked, rotated, and aligned properly with respect to each other. After the steps of stacking, rotating, and aligning of the leadframes, the two leadframes 10 can be tack welded to each other at any location along the siderails. Multiple (at least two) tack welding spots are recommended to securely bond the two dual-in-line leadframes 10 together to form a single quad leadframe 30. By tack welding the leadframes 10 together, a single quad leadframe 30 can be shipped to a customer or assembly site for assembly in a quad package.

The disclosed method of making a quad leadframe is much more cost effective than conventional methods of making a quad leadframe having aluminized lead tips. A cladding process is used instead of EBEP or IPP. Furthermore, the dual-in-line configuration can be stamped with the aluminum already clad to the lead tips. One consideration in a quad leadframe made by the inventive method is that the two sides of the leads are on a different plane than the other two sides of the leads due to the stacking. However, this minor difference can be compensated by downsetting all of the leads to a common plane.

Figure 3:
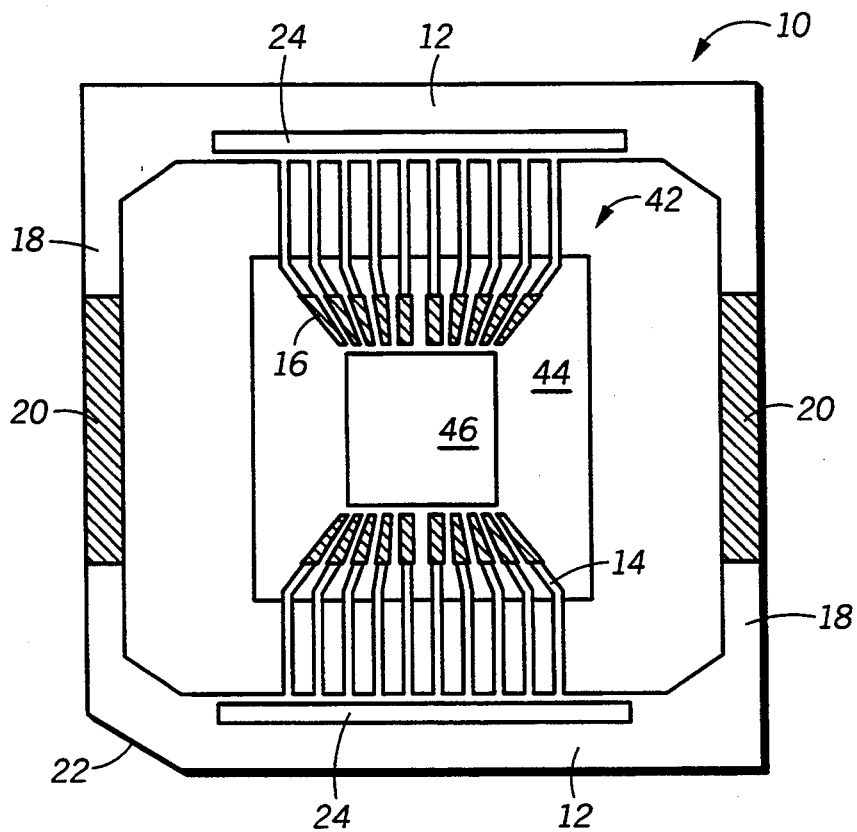
FIGS. 3–6 illustrate process steps for making a quad semiconductor device using two identical leadframes of FIG. 1, in accordance with another method of the invention.

FIGS. 3–6 illustrate a method of making a quad semiconductor device 40 using multiple dual-in-line leadframes in accordance with the invention. In FIG. 3, a first dual-in-line leadframe 10 is aligned over a base 42. Base 42 can be ceramic or another material having a coefficient of thermal expansion that substantially matches the coefficient of thermal expansion of a semiconductor die to minimize thermal stress. The base member 42 has a lead supporting surface 44 and a die cavity 46. Die cavity 46 is a recess in the base member 42 for receiving a semiconductor die, but is optional because the semiconductor die can also be mounted on a surface which is coplanar with the lead supporting surface 44. A recessed die cavity is more common in the art, however, because it allows for a lower overall package profile in a finished device. The lead supporting surface 44 has a sealing glass 48 (illustrated in FIG. 6) which has been screen printed onto the surface 44. This practice of screen printing glass onto a ceramic base is a common practice in the art. Typically, ceramic base manufacturers supply the bases with the glass prescreen printed onto the periphery of the base.

Figure 4:
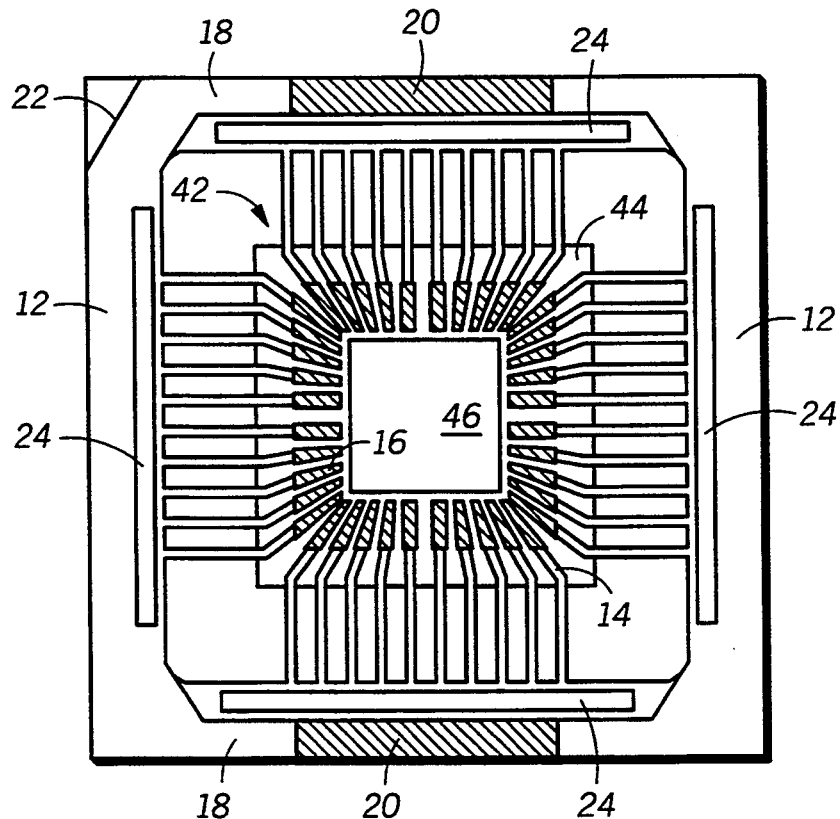

In FIG. 4, a second dual-in-line leadframe is placed above the first leadframe. The second leadframe is rotated by 90° with respect to the first leadframe so that the leads of the second leadframe are perpendicular with the leads of the first leadframe to form a quad lead configuration. The siderails of the both first and second leadframes are used for alignment of the two leadframes. The siderails 12 of one leadframe are aligned with the siderails 18 of the other leadframe. After the step of alignment, the glass is reflowed so that the leads 14 become embedded in the glass seal. This is known as a glass embedding process. The glass is typically reflowed at approximately 450° C., although lower or higher temperatures may also be used depending on the material. Some glass seal materials can be reflowed at 350° C. while others may require a higher reflowing temperature of approximately 500° C. Developments are also ongoing for lower reflowing temperatures in glass seals, possible going to 300° C. or even lower. Lower processing temperatures are more desirable from an assembly point of view. It is important to note that the glass seal is reflowed only once to embed both sets of leads of the two leadframes to the base member 42.

Figure 5:
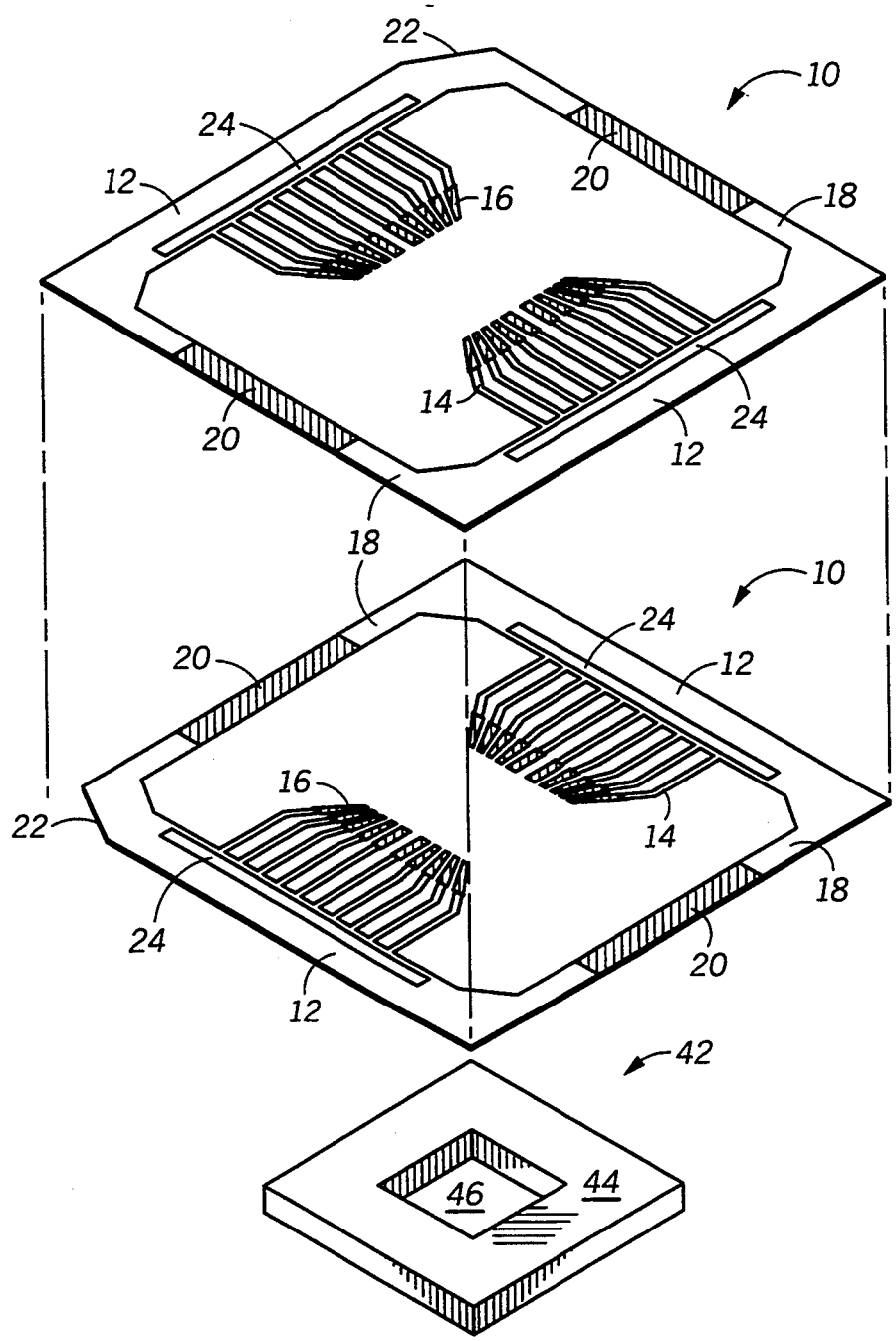

FIG. 5 gives an exploded orthogonal view of the FIG. 4. As illustrated, two dual-in-line leadframes 10 are combined to form a quad configuration. The two leadframes are stacked above the base member 42 and are then glass embedded to the base member 42 as discussed above. If the two dual-in-line leadframes were tack welded together before assembly, then separate alignment of each leadframe on top of the base member 42 is not necessary. The tack welded leadframe can be assembled like any other conventional quad leadframe.

Figure 6:
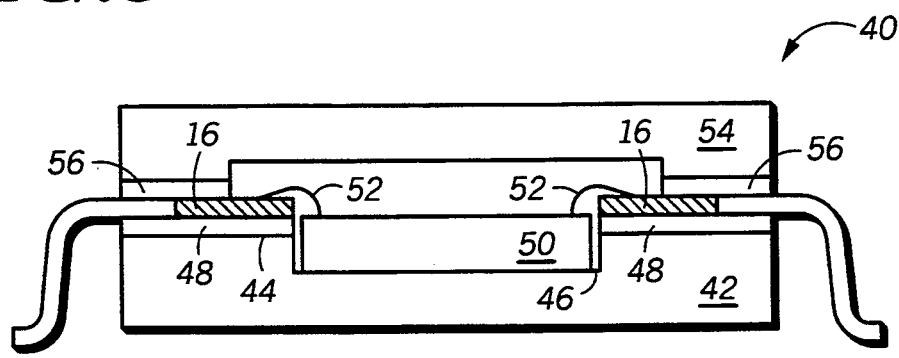

FIG. 6 illustrates a quad semiconductor device 40 made with two dual-in-line leadframes as discussed in FIGS. 3-5. After the step of attaching the leadframes to the lead supporting surface on the base member, a semiconductor die 50 is mounted inside the die cavity of the base member. Alternatively, the die could also be mounted inside the die cavity prior to the glass reflow. A plurality of wire bonds 52 electrically connect the semiconductor die to the leads 14. Aluminum wire or aluminum-alloy wire is most often used in ceramic packages, although gold wire or gold-alloy wire may also be used. However, due to the high processing temperatures in the assembly of a ceramic package, gold is not often used because it can lead to the formation of intermetallics which are believed to be detrimental to the reliability of metal bonds. A cover member 54, typically ceramic although other materials which match the thermal expansion coefficient of the base member can also be used, encloses the semiconductor die 50 and the wire bonds 52 inside a package body. The cover member is sealed to the base member with another glass seal 56. The external configuration of the leads 14 may vary although FIG. 6 illustrates a gull-wing lead configuration. Other examples of possible external lead configurations include J-lead and a through-hole pin type configuration.

The foregoing description and illustrations contained herein demonstrate many of the advantages associated with the present invention. In particular, a cost effective method for making a quad leadframe having aluminized lead tips has been revealed. The manufacturing of such a leadframe utilizes conventional cladding and stamping technology used in dual-in-line leadframes while producing a quad leadframe. Another advantage is that the present invention eliminates the need for more costly aluminizing techniques such as EBEP or IPP. Furthermore, the elimination of the EBEP and IPP processes allows stamping of the leadframes to become fully automated and cost effective method of producing high volumes of the leadframes. Moreover, the invention also provides a method for making a quad semiconductor device using multiple dual-in-line leadframes. Additionally, the invention allows flexibility in the making of the quad leadframe. The quad leadframe can be tack welded at the leadframe supplier for immediate assembly use at a semiconductor assembly site; or the leadframe can be shipped to the assembly site as separate dual-in-line leadframes to be combined together into a quad leadframe during the assembly process.

Thus it is apparent that there has been provided, in accordance with the invention, a method for making a quad leadframe having aluminized lead tips and a method for making a quad semiconductor device using said quad leadframe that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the base member and cover member may be of a material other than ceramic, such as anodized aluminum or a composite material. An epoxy seal can also be substituted for a glass seal if hermeticity is not a concern. In addition, the invention is not limited to any specific external lead configuration of a semiconductor device. The device may have gull-wing leaded, J-leaded or any other lead configuration. It is also important to note that the present invention is not limited in any way to any specific type of semiconductor devices. Furthermore, it may also be possible to use the semiconductor die as the base member and directly attach the multiple leadframes to the die surface using a lead-on-chip type adhesive tape. The cover member would then be coupled directly to the periphery of the semiconductor die. Therefore, it is intended that this invention encompass all such variations and modifications falling within the scope of the appended claims.

What is claimed is:

1. A method for making a quad leadframe for a semiconductor device, comprising the steps of:

providing a first and substantially similar second leadframe, each having a dual-in-line lead configuration, each leadframe having a first two opposing siderails and a plurality of leads connected to the first two siderails, the plurality of leads having a metal clad layer on lead tips which are distal to the first two opposing siderails, each leadframe having a second two opposing siderails which are not connected to any leads;

stacking the first and substantially similar second leadframe on top of one another;

rotating the first leadframe with respect to the substantially similar second leadframe by substantially 90° so that the plurality of leads of the first leadframe is substantially 90° out of phase with respect to the plurality of leads of the second leadframe;

aligning the first and substantially similar second leadframes to each other by aligning the first two opposing siderails of the first leadframe to the second two opposing siderails of the second leadframe, wherein the plurality of leads of the first leadframe and the plurality of leads of the second leadframe combine to form a quad-configuration; and tack welding a portion of the first and second leadframes together after the step of aligning.

2. The method according to claim 1, wherein the step of providing a first and second leadframe comprises providing a leadframe composed of a first metal, the leadframe having a clad layer composed of a second metal on the lead tips.

3. The method according to claim 2 wherein the step of providing comprises providing an Alloy 42 leadframe having aluminum clad lead tips.

4. A method for making a quad semiconductor device, comprising the steps of:

providing a base member having a lead supporting surface;

providing a first and second leadframe, each having a dual-in-line lead configuration, wherein each leadframe has a first two opposing siderails and a plurality of leads connected to the first two opposing siderails, the plurality of leads having a metal clad layer on lead tips which are distal to the first two opposing siderails, each leadframe having a second two opposing siderails which are not connected to any leads;

rotating the second leadframe with respect to the first leadframe by substantially 90° so that the plurality of leads of the second leadframe is substantially 90° out of phase with respect to the plurality of leads of the first leadframe;

aligning the first and second leadframes to each other by aligning the first two opposing siderails of the first leadframe to the second two opposing siderails of the second leadframe, wherein the plurality of leads of the first leadframe and the plurality of leads of the second leadframe combine to form a quad-configuration;

attaching the plurality of leads of the first leadframe to a first two sides of a periphery of the lead supporting surface of the base member;

attaching the plurality of leads of the second leadframe to a second two sides of the periphery of the lead supporting surface of the base member;

mounting a semiconductor die onto the base member;

wire bonding the semiconductor die to the pluralities of leads of the first and second leadframes;

sealing a cover member over the semiconductor die and a portion of the pluralities of leads of the first and second leadframes, wherein the metal clad lead tips are contained within the device; and trimming and forming the pluralities of leads of both the first and second leadframe such that the first and second two siderails of each leadframe are removed from the semiconductor device.

5. The method according to claim 4, wherein the steps of attaching the plurality of leads of the first and second leadframe comprise a glass embedding process.

6. The method according to claim 5, wherein the glass embedding process is performed at a temperature substantially in a range of 300° C. to 500° C.

7. The method according to claim 4, wherein the steps of attaching the plurality of leads of the first and second leadframes are performed concurrently.

8. The method according to claim 4, wherein the step of providing a first and second leadframe comprises providing a leadframe composed of a first metal, the leadframe having a clad layer composed of a second metal on the lead tips.

9. The method according to claim 8, wherein the step of providing a leadframe comprises providing an Alloy 42 leadframe having aluminum clad lead tips.

10. The method according to claim 4, wherein the step of providing a base member comprises providing a ceramic base.

11. A method for making a quad semiconductor device, comprising the steps of:

providing a base member having a lead supporting surface;

providing a first and second leadframe, each having a dual-in-line lead configuration, wherein each leadframe has a first two opposing siderails and a plurality of leads connected to the first two opposing siderails, the plurality of leads having a metal clad layer on lead tips which are distal to the first two opposing siderails, each leadframe having a second two opposing siderails which are not connected to any leads;

stacking the first and second leadframe on top of one another;

rotating the first leadframe with respect to the second leadframe by substantially 90° so that the plurality of leads of the first leadframe is substantially 90° out of phase with respect to the plurality of leads of the second leadframe;

aligning the first and second leadframes to each other by aligning the first two opposing siderails of the first leadframe to the second two opposing siderails of the second leadframe, wherein the plurality of leads of the first leadframe and the plurality of leads of the second leadframe combine to form a quad-configuration;

physically bonding the first and second leadframes together after the step of aligning;

attaching the plurality of leads of both the first and second leadframe to a periphery of the lead supporting surface of the base member;

mounting a semiconductor die onto the base member;

wire bonding the semiconductor die to the pluralities of leads of the first and second leadframes;

sealing a cover member over the semiconductor die and a portion of the pluralities of leads of the first and second leadframes wherein the metal clad lead tips are contained within the device; and trimming and forming the pluralities of leads of both the first and second leadframe such that the first and second two siderails of each leadframe are removed from the semiconductor device.

12. The method according to claim 11, wherein the step of attaching the plurality of leads of the first and second leadframes comprise a glass embedding process.

13. The method according to claim 12, wherein the glass embedding process is performed at a temperature substantially in a range of 300° C. to 500° C.

14. The method according to claim 12, wherein the step of providing a first and second leadframe comprises providing a leadframe composed of a first metal, the leadframe having a clad layer composed of a second metal on the lead tips.

15. The method according to claim 14, wherein the step of providing a leadframe comprises providing an Alloy 42 leadframe having aluminum clad lead tips.

16. The method according to claim 11, wherein the step of providing a base member comprises providing a ceramic base.

17. The method according to claim 11, wherein the step of physically bonding comprises tack welding the first and second leadframe together on a portion of the siderails.

18. The method according to claim 11, wherein the step of wire bonding comprises wire bonding a wire material selected from a group consisting of: aluminum, aluminum alloy, gold, and gold alloy.

* * * * *